US010256378B2

(12) United States Patent
Doi et al.

(10) Patent No.: US 10,256,378 B2
(45) Date of Patent: Apr. 9, 2019

(54) LED DEVICE, LED MODULE AND ULTRAVIOLET LIGHT EMITTING DEVICE

(71) Applicant: Sumitomo Chemical Company, Limited, Tokyo (JP)

(72) Inventors: Atsunori Doi, Tsukuba (JP); Katsuhiko Iwasaki, Tokyo (JP); Kentaro Masui, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/576,386

(22) PCT Filed: May 19, 2016

(86) PCT No.: PCT/JP2016/064851
§ 371 (c)(1),
(2) Date: Nov. 22, 2017

(87) PCT Pub. No.: WO2016/190207
PCT Pub. Date: Dec. 1, 2016

(65) Prior Publication Data
US 2018/0159000 A1 Jun. 7, 2018

(30) Foreign Application Priority Data

May 28, 2015 (JP) .................................. 2015-108615

(51) Int. Cl.
*H01L 33/54* (2010.01)
*H01L 33/52* (2010.01)
(Continued)

(52) U.S. Cl.
CPC ............ *H01L 33/54* (2013.01); *H01L 27/156* (2013.01); *H01L 33/486* (2013.01); *H01L 33/52* (2013.01); *H01L 33/56* (2013.01)

(58) Field of Classification Search
None
See application file for complete search history.

(56) References Cited

U.S. PATENT DOCUMENTS 7,497,597 B2 * 3/2009 Suehiro .................. H01L 33/56
257/100
2006/0261364 A1 * 11/2006 Suehiro .................. H01L 33/56
257/100
(Continued)

FOREIGN PATENT DOCUMENTS

JP 2001196636 A 7/2001
JP 2002141559 A 5/2002
(Continued)

OTHER PUBLICATIONS

Int'l Search Report dated Aug. 16, 2016 in Int'l Appplication No. PCT/JP2016/064851.
(Continued)

*Primary Examiner* — Dung A. Le
(74) *Attorney, Agent, or Firm* — Panitch Schwarze Belisario & Nadel LLP

(57) ABSTRACT

An LED device is provided which includes a substrate, an LED element disposed on the substrate, an inorganic glass molded body disposed at a position where all or a part of the light which is emitted from the LED element passes through, a first bonding portion that is provided in contact with the substrate and bonds the substrate and the inorganic glass molded body, and a second bonding portion provided between the LED element and the inorganic glass molded body. The LED element is shielded from the outside air by the substrate, the inorganic glass molded body and the first bonding portion. A material which forms the second bonding portion contains a condensation polymerization-type sili-
(Continued)

cone resin. A distance between the LED element and the inorganic glass molded body is 0.1 mm or less.

14 Claims, 9 Drawing Sheets

(51) Int. Cl.
  *H01L 27/15* (2006.01)
  *H01L 33/48* (2010.01)
  *H01L 33/56* (2010.01)

(56) References Cited

U.S. PATENT DOCUMENTS

| | | | | |
|---|---|---|---|---|
| 2007/0267645 | A1* | 11/2007 | Nakata | H01L 33/58 257/98 |
| 2009/0008673 | A1 | 1/2009 | Kato et al. | |
| 2012/0104452 | A1 | 5/2012 | Miyoshi et al. | |
| 2013/0063024 | A1* | 3/2013 | Wada | H01L 33/56 313/512 |
| 2017/0263817 | A1* | 9/2017 | Hirano | H01L 33/24 |

FOREIGN PATENT DOCUMENTS

| | | |
|---|---|---|
| JP | 2005158949 | 6/2005 |
| JP | 2007019459 A | 1/2007 |
| JP | 2007311707 A | 11/2007 |
| JP | 2010219324 A | 9/2010 |
| JP | 2012099544 A | 5/2012 |
| JP | 2013197236 A | 9/2013 |
| JP | 2014011364 A | 1/2014 |
| JP | 2014072212 A | 4/2014 |
| WO | 2015157178 A1 | 10/2015 |

OTHER PUBLICATIONS

Office Action dated Dec. 3, 2018 in CN Application No. 201680029996.6.

Extended European Search Report dated Feb. 15, 2019 in EP Application 16799913.5.

* cited by examiner

LED DEVICE, LED MODULE AND ULTRAVIOLET LIGHT EMITTING DEVICE

CROSS-REFERENCE TO RELATED APPLICATION

This application is a Section 371 of International Application No. PCT/JP2016/064851, filed May 19, 2016, which was published in the Japanese language on Dec. 1, 2016, under International Publication No. WO 2016/190207 A1, and which claims priority to Japanese Patent Application No. 2015-108615, filed on May 28, 2015, and the disclosures of which are incorporated herein by reference.

TECHNICAL FIELD

The present invention relates to an LED device, an LED module and an ultraviolet light emitting device.

Priority is claimed on Japanese Patent Application No. 2015-108615, filed May 28, 2015, the content of which is incorporated herein by reference.

BACKGROUND ART

In recent years, a UV-LED device that emits ultraviolet light has been adopted as a light source of a UV irradiation device in order to reduce power consumption and to make the device size compact.

In an LED device, an LED element is encapsulated so as to be protected from a physical impact caused by the use thereof. In general, encapsulating with a resin is performed as a form of encapsulating. As the resin, for example, an epoxy resin, a silicone resin or the like is used. In a UV-LED device encapsulated with a resin, the resin deteriorates due to ultraviolet light emitted from a UV-LED element, and cracks occur in some cases.

As an encapsulated LED device superior in ultraviolet light tolerance (hereinafter sometimes referred to as "light resistance"), one in which an LED element is encapsulated by melting and bonding inorganic glass to the LED element is known (for example, see Patent Document 1). However, since this LED device involves a process of melting and bonding inorganic glass, there are cases where the LED element is damaged by high temperature (for example, 400° C.) during the melting and bonding process.

Accordingly, as an LED device utilizing the excellent light resistance of inorganic glass and the optical properties of inorganic glass lens to the utmost and in which an LED element is encapsulated without involving a high-temperature process, an LED device provided with a resin filled in a case for accommodating an LED element, and an inorganic glass lens placed on the case so as to cover the resin is known (for example, see Patent Document 2).

CITATION LIST

Patent Documents

[Patent Document 1] Japanese Unexamined Patent Application, First Publication No. 2001-196636
[Patent Document 2] Japanese Unexamined Patent Application, First Publication No. 2014-11364

SUMMARY OF INVENTION

Technical Problem

In the encapsulating of an LED element, bubbles may be generated due to the chemical reaction or the like of a resin used for the encapsulating. When these bubbles are caught in the resin of a light transmitting portion (that is, the portion through which the light emitted from the LED element passes) (in other words, when the bubbles are fixed while remaining in the resin of the light transmitting portion), the light emitted from the LED element is totally reflected or refracted at an interface between the resin and the bubble, so that the light quantity of the LED device may be reduced.

In the LED device described in Patent Document 2, attempts have been made to reduce the incorporation of bubbles into the resin of the light transmitting portion by controlling the shape of the inorganic glass lens. However, although this method is capable of limiting the presence of bubbles to the peripheral portion of the lens, the incorporation of bubbles into the resin still remains problematic, and the reduction of the transmittance of the light beam passing therethrough cannot be suppressed.

Accordingly, the present invention has an object of providing an LED device containing an inorganic glass molded body, in which an LED element is not damaged by a high temperature process and incorporation of bubbles into a resin of a light transmitting portion is suppressed. The present invention also has an object of providing an LED module and an ultraviolet light emitting device including the above LED device.

Solution to Problem

The present invention includes the following aspects.

(1) An LED device including:
a substrate;
an LED element disposed on the substrate;
an inorganic glass molded body disposed at a position where all or a part of light which is emitted from the LED element passes through;
a first bonding portion that is provided in contact with the substrate and bonds the substrate and the inorganic glass molded body; and a second bonding portion provided between the LED element and the inorganic glass molded body, wherein the LED element is shielded from the outside air by the substrate, the inorganic glass molded body and the first bonding portion;
a material forming the second bonding portion contains a condensation polymerization-type silicone resin; and a distance between the LED element and the inorganic glass molded body is 0.1 mm or less.

(2) An LED device including:
a substrate;
an LED element disposed on the substrate;
an inorganic glass molded body disposed at a position where all or a part of light which is emitted from the LED element passes through; and
a bonding portion that is provided in contact with the substrate and bonds the substrate and the inorganic glass molded body,
wherein the LED element is shielded from the outside air by the substrate, the inorganic glass molded body and the bonding portion;
a material forming the bonding portion contains a silicone resin; and
a distance between the LED element and the inorganic glass molded body is 0 mm.

(3) The LED device according to (1) or (2), wherein the inorganic glass molded body includes a convex portion covering at least a part of a side surface of the LED element.

(4) The LED device according to (3), wherein the convex portion encloses a periphery of the LED element in a closed ring shape in a plan view.

(5) The LED device according to any one of (1), (3) and (4), wherein the material forming the first bonding portion includes a curable resin.

(6) The LED device according to (5), wherein the curable resin is a silicone resin.

(7) The LED device according to any one of (1) to (6), wherein the inorganic glass molded body is composed of silica glass or borosilicate glass.

(8) The LED device according to any one of (1) to (7), wherein a peak wavelength of the light which is emitted from the LED element is 400 nm or less.

(9) The LED device according to any one of (1) to (8), wherein the LED element is flip-chip mounted on the substrate.

(10) The LED device according to any one of (1) and (3) to (9), wherein the first bonding portion internally embeds the LED element and the inorganic glass molded body.

(11) The LED device according to any one of (1) to (10) including a plurality of the LED elements, wherein the inorganic glass molded body is disposed at a position where all or a part of light which is emitted from the plurality of LED elements passes through.

(12) An LED module including a plurality of the LED devices according to any one of (1) to (11).

(13) An ultraviolet light emitting device including the LED device according to any one of (L) to (11), or the LED module according to (12).

Advantageous Effects of Invention

According to the present invention, it is possible to provide an LED device including an inorganic glass molded body imparting various optical functions such as a light condensing function, and in which an LED element is not damaged by a high temperature process and incorporation of bubbles into a resin in a light transmitting portion is suppressed. The present invention can also provide an LED module and an ultraviolet light emitting device including the above LED device.

DESCRIPTION OF EMBODIMENTS

Figure 1A:
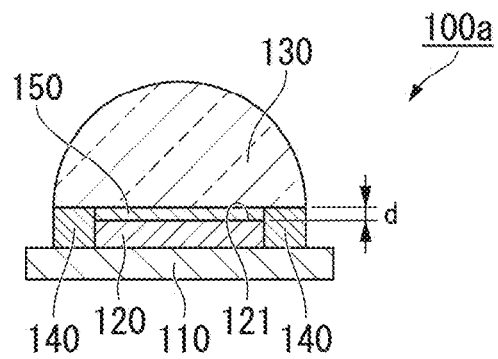
FIG. 1A is a cross-sectional view showing an embodiment of an LED device.

Hereinafter, embodiments of the present invention will be described in detail with reference to the drawings as needed. It should be noted that in the drawings, the same or corresponding parts are denoted by the same or corresponding reference numerals, and duplicated explanations are omitted. Further, the dimensional ratios in the respective drawings may be exaggerated for explanatory purposes and do not necessarily coincide with the actual dimensional ratios.

<LED Device>

One aspect of the LED device according to an embodiment of the present invention is an LED device including: a substrate; an LED element disposed on the substrate; an inorganic glass molded body disposed at a position where all or a part of light which is emitted from the LED element passes through; a first bonding portion that is provided in contact with the substrate and bonds the substrate and the inorganic glass molded body; and a second bonding portion provided between the LED element and the inorganic glass molded body, wherein the LED element is shielded from the outside air by the substrate, the inorganic glass molded body and the first bonding portion; a material forming the second bonding portion contains a condensation polymerization-type silicone resin (that is, the second bonding portion contains a cured product of a condensation polymerization-type silicone resin); and a distance between the LED element and the inorganic glass molded body is 0.1 mm or less.

Another aspect of the LED device according to an embodiment of the present invention is an LED device including: a substrate; an LED element disposed on the substrate; an inorganic glass molded body disposed at a position where all or a part of light which is emitted from the LED element passes through; and a bonding portion that is provided in contact with the substrate and bonds the substrate and the inorganic glass molded body, wherein the LED element is shielded from the outside air by the substrate, the inorganic glass molded body and the bonding portion; a material forming the bonding portion contains a silicone resin (that is, the bonding portion contains a cured product of a silicone resin); and a distance between the LED element and the inorganic glass molded body is 0 mm.

Since the LED device according to an embodiment of the present invention can be manufactured without involving a step of melting and bonding the inorganic glass to the LED element, the LED element is not damaged by a high temperature process. In addition, the distance between the LED element and the inorganic glass molded body is short, and the amount of resin contained between the LED element and the inorganic glass molded body (that is, the resin constituting the second bonding portion) can be limited to a very small amount. For this reason, generation of bubbles that may be incorporated by the resin can be suppressed. Alternatively, in those cases where the LED device according to an embodiment of the present invention does not have a resin between the LED element and the inorganic glass molded body and does not have a portion bonding the two (that is, the second bonding portion), it is possible to limit the amount of gap between the inorganic glass molded body and the LED element to a very small amount. Therefore, it is possible to reduce the amount of bubbles that may be incorporated by the resin constituting the bonding portion between the substrate and the inorganic glass molded body due to a temperature change or the like.

Usually, the amount of light emitted from the LED element decreases due to reflection or refraction at the interface between the resin and the bubbles. However, the LED device according to an embodiment of the present invention has a favorable light transmittance since the incorporation of bubbles in the resin constituting the bonding portion is reduced for the reasons described above. In addition, by including the inorganic glass molded body, the LED device according to an embodiment of the present invention can significantly reduce the absorption of ultraviolet light due to the deterioration of the resin in the light transmitting portion, has favorable durability, and can impart various optical functions such as a light condensing function by controlling the shape of the inorganic glass molded body.

FIGS. 1A to 1E and FIGS. 2A to 2D are sectional views showing an LED device according to an embodiment of the present invention and a modified example thereof, respectively.

As shown in FIG. 1A, an LED device 100a according to an embodiment of the present invention includes a substrate 110, an LED element 120 disposed on the substrate 110, an inorganic glass molded body 130 disposed at a position where all or a part of light which is emitted from the LED element 120 passes through (that is, a position covering a light emitting surface 121 (the side surface is also a light emitting surface) of the LED element 120), a first bonding portion 140 that is provided in contact with the substrate 110 and bonds the substrate 110 and the inorganic glass molded body 130, and a second bonding portion 150 provided between the LED element 120 and the inorganic glass molded body 130, wherein the LED element 120 is shielded from the outside air by the substrate 110, the inorganic glass molded body 130 and the first bonding portion 140; and a distance d between the LED element 120 and the inorganic glass molded body 130 (that is, the shortest distance in the thickness direction of the second bonding portion 150) is more than 0 mm and equal to or less than 0.1 mm.

The LED element 120 is usually bonded and fixed to the substrate 110 with a silver paste, a silicone die-bonding material, or the like.

Further, the distance between the first bonding portion 140 and the LED element 120 is preferably 0 mm or more and 0.5 mm or less, and more preferably 0 mm or more and 0.1 mm or less.

The surface of the LED element opposite to the side in contact with the substrate may be fully or partially filled with the second bonding portion. The area of the surface of the LED element where the second bonding portion covers is preferably 50% or more, more preferably 70% or more, and still more preferably 90% or more with respect to the area of the surface of the LED element. By setting the area of the surface of the LED element covered by the second bonding portion within this range, the LED element and the inorganic glass molded body are bonded even more closely.

Here, if the distance between the LED element 120 and the inorganic glass molded body 130 is not constant, the longest distance (maximum distance) between the LED element 120 and the inorganic glass molded body 130 may be set as the distance d.

Figure 1B:
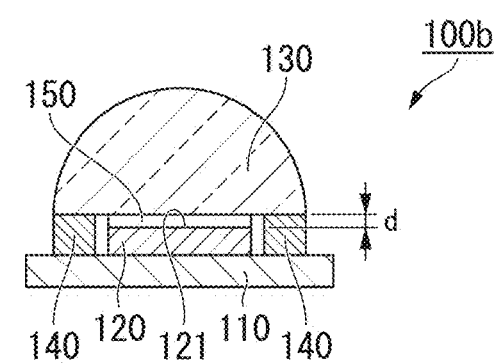
FIG. 1B is a cross-sectional view showing a modified example of the LED device.

FIG. 1B is a cross-sectional view showing an LED device 100b which is a modified example of the LED device 100a described above.

As in the LED device 100b, a gap may be present between the LED element 120 and the first bonding portion 140, and a second bonding portion may be present between the LED element 120 and the inorganic glass molded body 130. In such a device configuration, by setting the distance d to be greater than 0 mm and equal to or less than 0.1 mm, the absolute amount of the void contained between the inorganic glass molded body 130 and the LED element 120 can be limited, and the possibility of gas being generated in the resin constituting the first bonding portion and the second bonding portion by the influence of thermal expansion due to the temperature change of the gas contained in the void can be suppressed.

The state referred to as being shielded from the outside air by the first bonding portion 140 includes not only a state where the LED element 120 is encapsulated without the presence of gaps between the LED element 120 and the first bonding portion 140 or between the LED element 120 and the inorganic glass molded body 130, but also a state where the LED 120 is encapsulated while some voids are partially present between the LED element 120 and the bonding portion 140 or between the LED element 120 and the inorganic glass molded body 130.

Figure 1C:
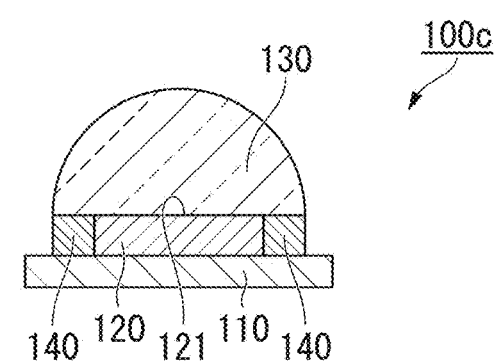
FIG. 1C is a cross-sectional view showing a modified example of the LED device.

FIG. 1C is a cross-sectional view showing an LED device 100c which is another modified example of the LED device 100a described above. In the LED device according to an embodiment of the present invention, as in the LED device 100c, the LED element 120 and the inorganic glass molded body 130 may be in contact with each other. That is, the distance d is 0 mm, and the second bonding portion 150 does not need to be present. By configuring in such a manner, it is possible to reduce the absolute amount of the resin contained between the inorganic glass molded body 130 and the LED element 120 as much as possible, and it is effective in suppressing the generation of bubbles in the resin.

Figure 1D:
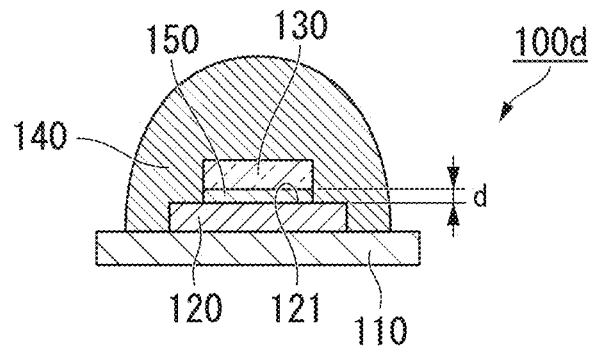
FIG. 1D is a cross-sectional view showing a modified example of the LED device.

FIG. 1D is a cross-sectional view showing an LED device 100d which is another modified example of the LED device 100a described above. As in the LED device 100d, the bonding portion 140 may be present on the surface of the inorganic glass molded body 130 opposite to the surface facing the LED element 120. In other words, the bonding portion 140 may embed the LED element 120 and the inorganic glass molded body 130 therein. By adopting such a configuration, it is possible to reduce the amount of the inorganic glass molded body 130 used, to reduce the weight of the LED device and to utilize the excellent light resistance of the inorganic glass molded body.

In the LED device, a second bonding portion 150 may be provided between the LED element and the inorganic glass molded body.

In the case where the second bonding portion 150 is provided, the distance d between the LED element 120 and the inorganic glass molded body 130 (that is, the shortest distance in the thickness direction of the second bonding portion 150) is preferably greater than 0 mm and equal to or less than 0.1 mm.

That is, yet another aspect of the LED device according to the present invention is an LED device including: a substrate; an LED element disposed on the substrate; an inorganic glass molded body disposed on the LED element; and a first bonding portion, wherein the first bonding portion is provided on a surface of the inorganic glass molded body opposite to a surface facing the LED element and internally embeds the LED element and the inorganic glass molded body, a material forming the first bonding portion contains a silicone resin (that is, the bonding portion contains a cured product of a silicone resin), and the LED element is shielded from the outside air by the substrate and the first bonding portion.

Furthermore, the LED device may be provided with a second bonding portion between the LED element and the inorganic glass molded body, and the distance d between the LED element and the inorganic glass molded body is preferably greater than 0 mm and equal to or less than 0.1 mm.

Figure 1E:
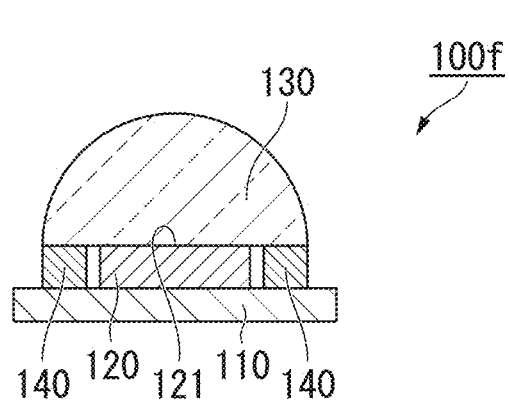
FIG. 1E is a cross-sectional view showing a modified example of the LED device.

FIG. 1E is a cross-sectional view showing an LED device 100*f* which is another modified example of the LED device 100*a* described above. In the LED device according to an embodiment of the present invention, as in the LED device 100*f*, a gap may be present between the LED element 120 and the first bonding portion 140, and the LED element 120 and the inorganic glass molded body 130 may be in contact with each other. That is, the distance d is 0 mm, and the second bonding portion 150 does not need to be present.

Figure 2A:
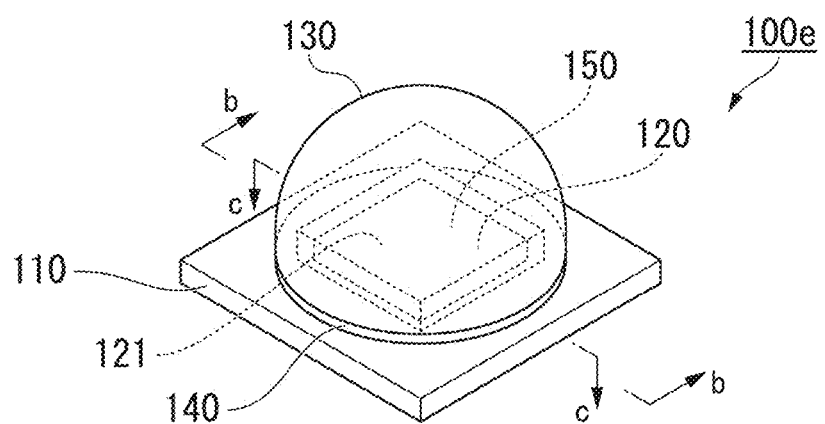
FIG. 2A is a perspective view showing an embodiment of an LED device.
Figure 2B:
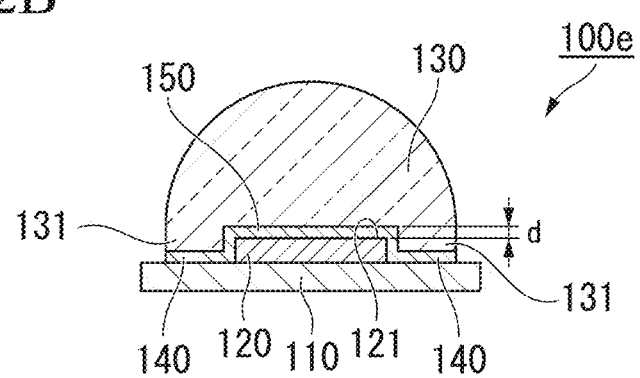
FIG. 2B is a cross-sectional arrow view taken along the line b-b in FIG. 2A.
Figure 2C:
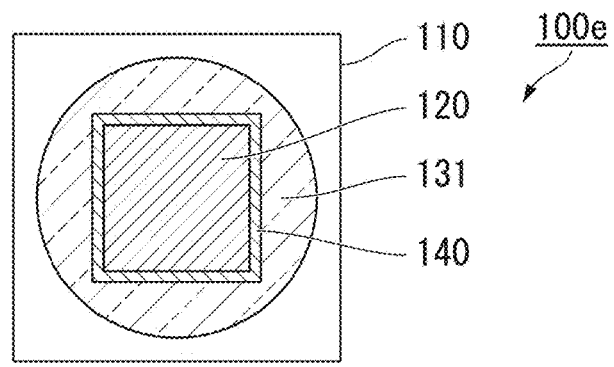
FIG. 2C is a cross-sectional arrow view taken along the line b-c in FIG. 2A.
Figure 2D:
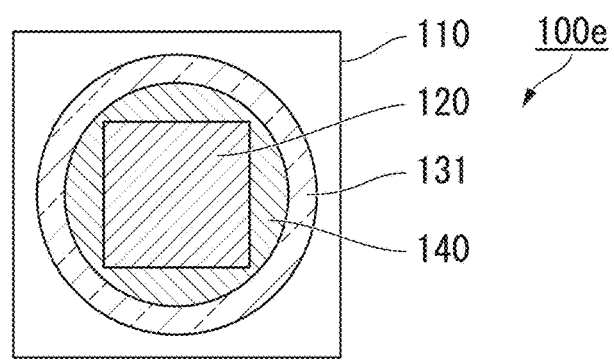
FIG. 2D is a cross-sectional view showing an embodiment of an LED device.

FIG. 2A is a perspective view showing an LED device 100*e* which is another modified example of the LED device 100*a* described above. FIG. 2B is a cross-sectional arrow view taken along the line b-b in FIG. 2A. FIG. 2C is a cross-sectional arrow view taken along the line c-c in FIG. 2A. FIG. 2D is a cross-sectional arrow view showing a modified example of the LED device 100*e* which is taken along a line corresponding to the line c-c in FIG. 2A.

That is, in yet another aspect of the LED device according to the present invention, as in the case of the LED device 100*e*, the inorganic glass molded body 130 may include a convex portion 131 covering at least a part of the side surface of the LED element 120. As described above, although light is also emitted from the side surface of the LED element 120, since the inorganic glass molded body 130 includes such a convex portion 131, an inorganic glass molded body will also be disposed in the vicinity of the side surface of the LED element 120, and an LED device excellent in heat resistance and light resistance can be realized. The LED element 120 and the inorganic glass molded body 130 may be in contact with each other. That is, the distance d is 0 mm, and the second bonding portion 150 does not need to be present.

The expression "covering at least a part of the side surface of the LED element" means that when the LED device is placed on a horizontal surface, the lowermost end of the inorganic glass molded body is only required to be located in the lower part of the LED element in one or two or more arbitrary cross sections in the vertical direction.

In addition, as shown in FIGS. 2C and 2D, the convex portion 131 may surround the periphery of the LED element 120 in a closed ring shape in a plan view. It should be noted that in the present specification, the phrase "in a plan view" means a state in which the direction of the substrate 110 is viewed from a direction perpendicular to the substrate 110.

Further, as shown in FIG. 2C, the cross-sectional shape of the convex portion 131 on a plane parallel to the substrate 110 may be a shape corresponding to the shape of the LED element 120 (for example, a shape having a certain distance with respect to the periphery of the LED element 120). Alternatively, as shown in FIG. 2D, the width of the convex portion 131 in a plan view may be constant.

Figure 3A:
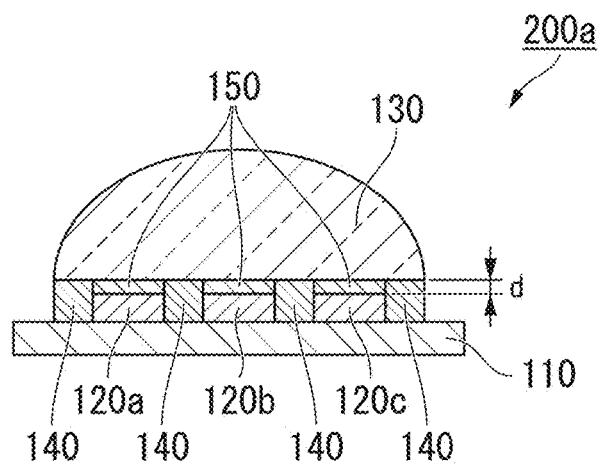
FIG. 3A is a cross-sectional view showing a modified example of the LED device.

The LED device according to an embodiment of the present invention may include a plurality of LED elements. FIG. 3A is a cross-sectional view showing an example of an LED device according to an embodiment of the present invention. As shown in FIG. 3A, an LED device 200*a* includes a substrate 110, a plurality of LED elements 120*a*, 120*b* and 120*c* disposed on the substrate 110, and an inorganic glass molded body 130 disposed at a position where all or a part of light which is emitted from the respective LED elements 120*a*, 120*b* and 120*c* passes through, wherein the substrate 110 and the inorganic glass molded body 130 are bonded by a bonding portion 140, the LED elements 120*a*, 120*b* and 120*c* are respectively shielded from the outside air by the substrate 110, the inorganic glass molded body 130 and the bonding portion 140, and a second bonding portion 150 is present between the LED elements 120*a*, 120*b* and 120*c* and the inorganic glass molded body 130. The distance d between each of the LED elements 120*a*, 120*b* and 120*c* and the inorganic glass molded body 130 is greater than 0 mm and equal to or less than 0.1 mm.

That is, yet another aspect of the LED device according to the present invention is an LED device including: a substrate; a plurality of LED elements disposed on the substrate; an inorganic glass molded body disposed at a position where all or a part of light which is emitted from each of the plurality of LED elements passes through; a first bonding portion bonding the substrate and the inorganic glass molded body; and a second bonding portion provided between the plurality of LED elements and the inorganic glass molded body, wherein the plurality of LED elements are shielded from the outside air by the substrate, the inorganic glass molded body and the first bonding portion, and a distance between each of the plurality of LED elements and the inorganic glass molded body is greater than 0 mm and equal to or less than 0.1 mm.

The LED device 200*a* is obtained by providing a plurality of LED elements to the LED device 100*a* described above. In the present specification, "a plurality of LED elements" means, for example, 2 to 100, preferably 2 to 50, more preferably 2 to 20, and still more preferably 2 to 10 LED elements.

Figure 3B:
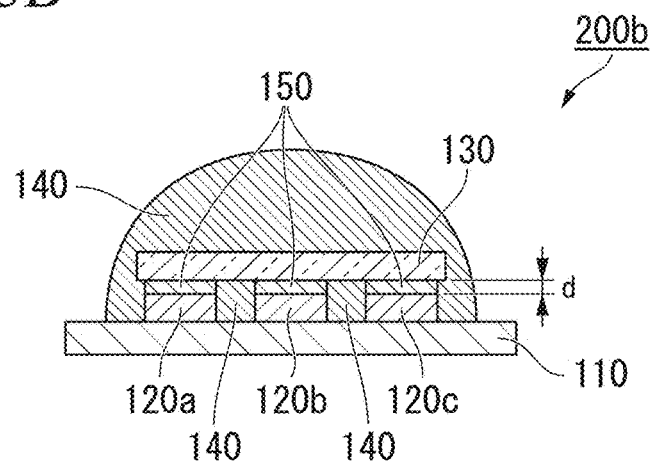
FIG. 3B is a cross-sectional view showing a modified example of the LED device.

FIG. 3B is a cross-sectional view showing an LED device 200*b* which is a modified example of the LED device 200*a* described above. The LED device 200*b* is obtained by providing a plurality of LED elements to the LED device 100*d* described above.

That is, yet another aspect of the LED device according to the present invention is an LED device including: a substrate; a plurality of LED elements disposed on the substrate; an inorganic glass molded body disposed on all of the plurality of LED elements; and a first bonding portion, wherein the first bonding portion is provided on a surface of the inorganic glass molded body opposite to a surface facing the plurality of LED elements and internally embeds the plurality of LED elements and the inorganic glass molded body, and the plurality of LED elements are shielded from the outside air by the substrate and the first bonding portion.

Furthermore, the LED device may be provided with a second bonding portion between the plurality of LED elements and the inorganic glass molded body, and the distance d between the plurality of LED elements and the inorganic glass molded body is preferably greater than 0 mm and equal to or less than 0.1 mm.

The LED device including a plurality of LED elements is not limited to the above-described LED devices 200a and 200b, and may be, for example, those obtained by providing a plurality of LED elements to the above-described LED device 100b, may be, for example, those obtained by providing a plurality of LED elements to the above-described LED device 100c, or may be, for example, those obtained by combining the LED devices 100a, 100b, 100c, 100d and the like.

Further, in the LED device according to an embodiment of the present invention, the number of the LED elements is not particularly limited as long as the distance d between each of the LED elements and the inorganic glass molded body can be set to 0.1 mm or less, and may be, for example, 1 to 100, may be, for example, 1 to 50, may be, for example, 1 to 20, or may be, for example, 1 to 10.

[Bubble]

A bubble refers to a minute portion (minute space) including gas generated in the resin constituting the LED device according to an embodiment of the present invention. In the present specification, the term "bubble" means a minute space having a size (major axis) of 0.1 mm or more when observed using an optical microscope and having an interface with the resin, and in which the interface has a spherical shape, a hemispherical shape, a cylindrical shape or a similar shape capable of defining an arc having a radius of curvature of 0.01 mm to 1.00 mm.

When the inorganic glass molded body and the base material are bonded using a resin, air enters between them and bubbles remain when the resin is cured, which can be mentioned as the cause of bubble generation.

Alternatively, when curing the resin, bubbles may be generated due to generation of outgas such as water vapor and alcohol components by the chemical reaction.

[Substrate]

In the LED device according to an embodiment of the present invention, the substrate 110 is not particularly limited as long as it is generally used as a substrate of a semiconductor light emitting device, and, for example, a substrate constituted of resins such as nylon, epoxy and liquid crystal polymers (LCP), or ceramics such as alumina, aluminum nitride and low-temperature co-fired ceramics (LTCC) is used. An electrode for electrically connecting an LED element 120 to be mounted is usually provided in the substrate 110.

[LED Element]

The LED element 120 is not particularly limited as long as it is generally used as an LED element, and examples thereof include a blue light emitting diode (LED), a red LED, a green LED, a white LED and an ultraviolet LED. It should be noted that in the present specification, the term "ultraviolet light" means light having a wavelength of at least 200 nm to 400 nm or less. These LEDs are manufactured by growing group III-V semiconductors such as AlInGaP, InGaN and AlGaN on, for example, sapphire, aluminum nitride or the like by the metal organic chemical vapor deposition method (MOCVD method) or the hydride vapor phase epitaxy method (HVPE method). Light is emitted not only from a surface opposing the substrate but also from a surface defined as a side surface with respect to that opposing surface.

In one aspect of the present invention, the LED element emits light with a peak wavelength from at least 200 nm to 400 nm or less. Here, the term "peak wavelength" refers to a wavelength of the light emitted from the LED element when the emission intensity is the highest.

In the LED device according to an embodiment of the present invention, the inorganic glass molded body having excellent heat resistance and light resistance is disposed at a position where all or a portion of the light which is emitted from the LED element passes through. Furthermore, the distance between the LED element and the inorganic glass molded body is very close which is 0.1 mm or less. For this reason, the inorganic glass molded body is disposed in the vicinity of the light irradiated surface of the LED element where the heat resistance and light resistance are most required, as a result of which an LED device excellent in heat resistance and light resistance can be realized.

It should be noted that the "distance between the LED element and the inorganic glass molded body" referred to here can be measured by a measuring method using a thickness gauge described in Examples described later.

Therefore, the LED device according to an embodiment of the present invention can exhibit excellent heat resistance and light resistance, even when the peak wavelength of the light which is emitted from the LED element is 400 nm or less (for example, in the case of 200 nm or more and 300 nm or less, or in the case of 250 nm or more and 300 nm or less).

At least one LED element 120 is installed on one substrate 110. In order to install the LED element 120, a flip chip method for electrically connecting an electrode provided on the surface of the LED element 120 on the side opposite to the light emitting surface 121 and an electrode provided on the substrate 110, or a face-up method for electrically connecting an electrode provided on the light emitting surface 121 of the LED element 120 and an electrode provided on the substrate 110 is used. In the case of the flip chip method, the electrode of the LED element 120 and the electrode on the substrate 110 are electrically connected by solder. In the face-up method, the electrode of the LED element 120 and the electrode on the substrate 110 are electrically connected by using a gold wire or the like. From the viewpoint of high degree of spatial freedom in the upper part of the LED element 120, it is preferable that the LED element 120 is mounted by a flip chip method in the LED device according to an embodiment of the present invention.

The size of the LED element is preferably from 0.1 to 5.0 mm, more preferably from 0.1 to 3.0 mm, and still more preferably from 0.1 to 2.0 mm. By making the size of the LED element within this range, fabrication of the LED device becomes easy.

The size of the LED device is preferably from 0.5 to 30.0 mm. By making the size of the LED device within this range, integration at the time of modularizing the LED device becomes easy.

[Resin]

In the LED device according to an embodiment of the present invention, examples of the material forming the bonding portion include a thermoplastic resin such as a fluororesin, a silicone resin and a curable resin such as an epoxy resin. Among these, a curable resin is preferable from the viewpoint of ease of encapsulating, and a silicone resin is more preferable from the viewpoint of excellent heat resistance and light resistance.

That is, each of the first bonding portion and the second bonding portion preferably includes a cured product of a thermoplastic resin such as a fluororesin, a silicone resin or a curable resin such as an epoxy resin, and more preferably includes a cured product of a silicone resin.

(Fluororesin)

The fluororesin is not particularly limited as long as it is a fluororesin used for encapsulating an LED element, and examples thereof include a polymer containing a structural unit derived from at least one monomer compound selected from the group consisting of vinylidene fluoride, tetrafluoroethylene, hexafluoropropylene and perfluoroalkyl vinyl ether. Further, as a commercially available fluororesin, for example, Kureha KF Polymer manufactured by Kureha Corporation can be mentioned as a polyvinylidene fluoride resin. The fluororesin may contain a phosphor, inorganic particles, a silane coupling agent or the like.

The expression "derived" means that the chemical structure changes due to polymerization.

(Epoxy Resin)

The epoxy resin is not particularly limited as long as it is an epoxy resin used for encapsulating an LED element, and, for example, an aromatic epoxy resin such as a diglycidyl ether of bisphenol A, a diglycidyl ether of bisphenol F and a phenol or cresol novolak-type epoxy resin; an alicyclic epoxy resin synthesized by oxidizing a cyclic olefin compound such as 3,4-epoxycyclohexylmethyl-3',4'-epoxycyclohexane carboxylate; a hydrogenated bisphenol A type epoxy resin in which an aromatic ring is converted to an alicyclic ring by hydrogenating a bisphenol A-type epoxy resin; a resin obtained by blending an isocyanurate ring-containing polyfunctional epoxy resin with an epoxy resin containing a hydrogenated bisphenol A-type epoxy resin, and the like can be used. The epoxy resin may contain a phosphor, inorganic particles, a silane coupling agent or the like.

(Silicone Resin)

As the silicone resin, an addition polymerization-type silicone resin, a condensation polymerization-type silicone resin and the like can be used. In the LED device according to an embodiment of the present invention, a condensation polymerization-type silicone resin is more preferable because it is excellent in heat resistance and light resistance. In addition, when a silicone resin is used for the second bonding portion, it is possible to reduce reflection due to the difference in refractive index with the inorganic glass molded body as compared with other resins.

The silicone resin can be cured by, for example, heating or the like, after being dissolved in an appropriate organic solvent, and, if necessary, prepared as a resin composition by adding a silicone oligomer, a phosphor, an inorganic particle, a catalyst for curing, or the like. As the organic solvent, an organic solvent having a boiling point of 100° C. or more is preferable, and examples of the organic solvent include glycol ether-based solvents such as ethylene glycol monomethyl ether, ethylene glycol monoethyl ether, ethylene glycol monoisopropyl ether, ethylene glycol monobutyl ether, ethylene glycol monohexyl ether, ethylene glycol monoethylhexyl ether, ethylene glycol monophenyl ether, ethylene glycol monobenzyl ether, diethylene glycol monomethyl ether, diethylene glycol monoethyl ether, diethylene glycol monoisopropyl ether, diethylene glycol monobutyl ether, diethylene glycol monohexyl ether, diethylene glycol monoethylhexyl ether, diethylene glycol monophenyl ether, diethylene glycol monobenzyl ether, propylene glycol monomethyl ether, propylene glycol monoethyl ether, propylene glycol monoisopropyl ether, propylene glycol monobutyl ether, propylene glycol monohexyl ether, propylene glycol monoethylhexyl ether, propylene glycol monophenyl ether, propylene glycol monobenzyl ether, dipropylene glycol monomethyl ether, dipropylene glycol monoethyl ether, dipropylene glycol monoisopropyl ether, dipropylene glycol monobutyl ether, dipropylene glycol monohexyl ether, dipropylene glycol monoethylhexyl ether, dipropylene glycol monophenyl ether and dipropylene glycol monobenzyl ether; and glycol ester-based solvents obtained by adding an acetic acid group to the above-described glycol ether-based solvents, such as ethylene glycol monoethyl ether acetate, ethylene glycol monoisopropyl ether acetate, ethylene glycol monobutyl ether acetate, ethylene glycol monohexyl ether acetate, ethylene glycol monoethylhexyl ether acetate, ethylene glycol monophenyl ether acetate and ethylene glycol monobenzyl ether acetate. For example, the heating temperature is preferably from 120 to 200° C. and more preferably from 140 to 200° C. The heating time is preferably from 0.5 to 24 hours and more preferably from 1 to 10 hours. By setting the heating temperature and heating time within these ranges, the cured product of the resin composition will have sufficient strength.

That is, one aspect of the bonding portion according to the present invention is a cured product of a resin composition containing a curable resin (for example, a silicone resin), an organic solvent, and, according to need, at least one component selected from the group consisting of a silicone oligomer, a phosphor, inorganic particles, and a curing catalyst.

The content of the curable resin is preferably from 50 to 100% by mass, more preferably from 60 to 90% by mass, and still more preferably from 65 to 85% by mass, with respect to the total mass of the resin composition. By setting the content of the curable resin within this range, coating properties of the resin composition become favorable, so that fabrication of the LED device becomes easy.

<<Addition Polymerization-Type Silicone Resin>>

Examples of the addition polymerization-type silicone resin include a methyl-based silicone resin, a phenyl-based silicone resin and a methyl phenyl-based silicone resin, and among them, a methyl-based silicone resin is preferable since the resin hardness after curing is relatively soft.

As these addition polymerization-type silicone resins, generally commercially available addition polymerization-type silicone resins can also be used. Specific examples thereof include OE-6250, OE-6336 and OE-6301 that are methyl-based silicone resin encapsulating materials manufactured by Dow Corning Toray Co., Ltd.; OE-6450, OE-6520, OE-6550, OE-6631, OE-6636, OE-6635, OE-6630 and OE-6665N that are phenyl-based or methyl phenyl-based silicone resin encapsulating materials manufactured by Dow Corning Toray Co., Ltd.; IVS4321, XE14-C2042, IVS4542, IVS4546, IVS4622, IVS4632, IVS4742, IVS4752, IVSG3445, IVSG5778, IVSG0810 that are methyl-based silicone resin encapsulating materials manufactured by Momentive Performance Materials Japan; XE14-C2860 and XE14-C3450 that are phenyl-based or methyl phenyl-based silicone resin encapsulating materials manufactured by Momentive Performance Materials Japan; KER-6020, KER-6150, KER-6075, KER-2700, KER-2600, KER-2500, KER-2450, KER-2400, KER-2300 that are methylsilicone resin encapsulating materials manufactured by Shin-Etsu Chemical Co., Ltd.; SCR-1011, SCR-1012, SCR-1016, ASP-1111, ASP-1120, ASP-1031, ASP-1040, KER-6150, KER-6075 and KER-6100 that are phenyl-based or methyl phenyl-based silicone resin encapsulating materials manufactured by Shin-Etsu Chemical Co., Ltd. In addition, as a dual type encapsulating material having both addition reaction-type and condensation reaction-type properties, YSL-300F and YSL-350F that are methyl-based silicone resin encapsulating materials manufactured by The Yokohama Rubber Co., Ltd., YSH-600F and YSH-650F that are phenyl-based silicone resins manufactured by The Yokohama Rubber Co., Ltd. and the like can be mentioned.

<<Condensation Polymerization-Type Silicone Resin>>

As the condensation polymerization-type silicone resin, for example, a encapsulating material containing polysiloxane described in the "catalog of silicone for electronics" issued in October 2010 by Dow Corning Toray Co., Ltd. and available on the Internet <URL: https://www.dowcoming-.co.jp/ja_JP/content/japan/japanproducts/Electronics-Silicone-Catalog2010.pdf> and the like can be mentioned. Examples of other condensation polymerization-type silicone resins include KR-220L, KR-242A, KR-271, KR-282, KR-300 and KR-311 that are straight silicone resins manufactured by Shin-Etsu Chemical Co., Ltd., YSL-250, YSL-251, YSH-550 and YSH-561 that are condensation type LED encapsulating materials manufactured by The Yokohama Rubber Co., Ltd., and Deep UV-200 manufactured by SCHOTT AG As the condensation polymerization-type silicone resin, a resin containing a silicone resin obtained by hydrolyzing and polycondensing a monomer compound represented by the following formula (1) as a main component can be mentioned. Here, the phrase "contain as a main component" means that the above-described silicone resin is contained, based on solid content, in an amount of, for example, 50% by mass or more, 60% by mass or more, 70% by mass or more, 80% by mass or more, 90% by mass or more, or even 100% by mass, with respect to the total mass of the solid content of the condensation polymerization-type silicone resin.

$$R^1_n Si(OR^2)_{(4-n)} \quad (1)$$

In the formula (1), $R^1$ represents an alkyl group having 1 to 10 carbon atoms which may have a substituent or an aryl group having 6 to 10 carbon atoms which may have a substituent, each $R^2$ independently represents an alkyl group having 1 to 10 carbon atoms which may have a substituent, an aryl group having 6 to 10 carbon atoms which may have a substituent, or a hydrogen atom, and n represents an integer of 0 to 4.

When $R^1$ or $R^2$ is an alkyl group, the alkyl group may be linear, branched or may have a cyclic structure. Further, the number of carbon atoms of the alkyl group is not particularly limited, and may be, for example, 1 to 10 carbon atoms, preferably 1 to 6 carbon atoms, and more preferably 1 to 3 carbon atoms.

In the alkyl group, one or two or more hydrogen atoms constituting the alkyl group may be substituted with another group. Examples of the substituent of the alkyl group include an aryl group having 6 to 10 carbon atoms such as a phenyl group and a naphthyl group, and a halogen atom such as a fluorine atom and a chlorine atom.

Specific examples of the alkyl group represented by $R^1$ or $R^2$ include unsubstituted alkyl groups such as a methyl group, an ethyl group, an n-propyl group, an isopropyl group, an n-butyl group, an isobutyl group, a tert-butyl group, a n-pentyl group, a neopentyl group, a hexyl group, an octyl group, a nonyl group and a decyl group, and aralkyl groups such as a phenylmethyl group, a phenylethyl group and a phenylpropyl group.

When $R^1$ or $R^2$ is an aryl group, examples of the aryl group include an aryl group having 6 to 10 carbon atoms.

Further, in the aryl group, one or two or more hydrogen atoms constituting the aryl group may be substituted with another group. Examples of the substituent of the aryl group include an alkyl group having 1 to 6 carbon atoms such as a methyl group, an ethyl group, a propyl group and a butyl group, and a halogen atom such as a fluorine atom and a chlorine atom.

Specific examples of the aryl group represented by $R^1$ or $R^2$ include unsubstituted aryl groups such as a phenyl group and a naphthyl group, and alkylaryl groups such as alkylphenyl groups including a methylphenyl group, an ethylphenyl group and a propylphenyl group.

Here, when n in the monomer compound represented by the above formula (1) is 1, since it may constitute a branched chain structure of three organopolysiloxane chains, the silicone resin obtained by hydrolyzing and polycondensing the monomer compound may form a network structure or a ring structure. Therefore, a cured product obtained by curing the above resin has high hardness and excellent heat resistance with little deterioration even when irradiated with ultraviolet rays.

On the other hand, when n in the monomer compound represented by the above formula (1) is 2, a cured product obtained by curing the above resin has excellent flexibility and favorable processability.

The silicone resin obtained by hydrolyzing and polycondensing the monomer compound represented by the above formula (1) is represented by the following formula (2).

$$(R^{11}R^{12}R^{13}SiO_{1/2})_M (R^{14}R^{15}SiO_{2/2})_D (R^{16}SiO_{3/2})_T (SiO_{4/2})_Q \quad (2)$$

In the formula (2), $R^{11}$ to $R^{16}$ each independently represents a hydrocarbon group such as an alkyl group and a phenyl group, or a halogen atom.

Each of the alkyl groups represented by $R^{11}$ to $R^{16}$ is independently preferably an alkyl group having 1 to 10 carbon atoms, more preferably an alkyl group having 1 to 6 carbon atoms, and still more preferably an alkyl group having 1 to 3 carbon atoms.

Examples of the alkyl group represented by $R^{11}$ to $R^{16}$ include unsubstituted alkyl groups such as a methyl group, an ethyl group, an n-propyl group, an isopropyl group, an n-butyl group, an isobutyl group, a tert-butyl group, an n-pentyl group, a neopentyl group, a hexyl group, an octyl group, a nonyl group and a decyl group, and substituted alkyl groups such as a phenylmethyl group, a phenylethyl group and a phenylpropyl group.

Each of the aryl groups represented by $R^{11}$ to $R^{16}$ is independently preferably an aryl group having 6 to 10 carbon atoms. Examples of the aryl group represented by $R^{11}$ to $R^{16}$ include an unsubstituted aryl group such as a phenyl group and a naphthyl group and a substituted aryl group such as a methylphenyl group, an ethylphenyl group and a propylphenyl group.

Each of the halogen atoms represented by $R^{11}$ to $R^{16}$ is independently preferably a fluorine atom or a chlorine atom.

In the formula (2), M, D, T and Q represent composition ratios, and are numbers of 0 or more and less than 1 that satisfy the formula: M+D+T+Q=1. The repeating unit constituting the polyorganosiloxane represented by the above formula (2) is a monofunctional type [$R^3 SiO_{0.5}$] (triorganosilhemioxane), a difunctional type [$R^2 SiO$](diorganosiloxane), a trifunctional type [$RSiO_{1.5}$] (organosilsesquioxane) or a tetrafunctional type [$SiO_2$] (silicate) (note that, for the sake of simplicity, $R^{11}$ to $R^{16}$ are collectively shown as R), and the composition of the silicone resin represented by the above formula (2) is determined by the composition ratio of these four types of repeating units.

In the case where the LED device has the second bonding portion, the same material as the material forming the above-mentioned bonding portion can be used as the material forming the second bonding portion. The material forming the bonding portion (that is, the first bonding portion) and the second bonding portion may be the same or different. That is, the cured product of the resin contained in the first bonding portion and the cured product of the resin contained in the second bonding portion may be the same or different.

[Inorganic Glass Molded Body]

In the LED device according to an embodiment of the present invention, as the inorganic glass molded body, an inorganic glass molded body formed from silica glass, borosilicate glass or the like can be mentioned.

(Silica Glass)

Examples of the types of silica glass include fused silica glass produced by electric melting/flame melting and synthetic silica glass produced by a gas phase method or liquid phase method. In particular, sol-gel silica glass produced by a sol-gel method among liquid phase methods is excellent in moldability, and can be suitably used for the LED device of the present embodiment for controlling optical properties based on the shape.

As silica glass produced by the sol-gel method, for example, as described in a known document (Science of Sol-Gel Method by Sumio Sakka. Agne Shofu Sha), silica glass of a bulk body produced by preparing a wet gel from a sol via a hydrolysis polycondensation reaction by using a silicon alkoxide such as tetramethoxysilane as a starting material, followed by drying and sintering steps is known. Alternatively, according to the method described in Patent Document (Japanese Unexamined Patent Application, First Publication No. 2009-137836), silica glass of a bulk body is obtained by adding a silicon alkoxide to a silica dispersion liquid using silica fine particles as a starting material and gelling the sol solution, followed by drying/sintering steps. In addition, silica glass produced by a method of preparing a precursor from an organic polymer binder and silica particles and sintering the precursor at a temperature of 1,100° C. is also known (see, for example, International Publication No. 2011/004852). The silica glass produced by these sol-gel methods is excellent in transparency and formability during the process, and can therefore be suitably used for the LED device of the present embodiment.

(Borosilicate Glass)

Borosilicate glass is a glass composed of $SiO_2$ as a main component (that is, containing $SiO_2$ at 50% or more), and $Al_2O_3$, $B_2O_3$, MgO, CaO, an alkali metal oxide component ($Li_2O$, $Na_2O$, $K_2O$) or the like. Among borosilicate glasses, those exhibiting favorable transmittance up to the ultraviolet region are known (see, for example, Japanese Patent No. 3192013), and can be suitably used for the LED device of the present embodiment.

(Shape of Inorganic Glass Molded Body)

In the LED device according to an embodiment of the present invention, the shape of the inorganic glass molded body is not particularly limited as long as it can transmit all or part of the light emitted from the LED element, and can shield the LED element from the outside air by the substrate, the inorganic glass molded body and the bonding portion, but it is preferable that the surface facing the LED element is a flat plate or a convex surface. For example, it may have a hemispherical lens shape like the inorganic glass molded body 130 shown in FIGS. 1A to 1C and FIG. 1E, or, for example, it may have a plate shape like the inorganic glass molded body 130 shown in FIG. 1D.

As the shape of the inorganic glass molded body, in addition to the above, for example, a shape such as a truncated cone shape, a cylindrical shape, a semi-elliptic spherical shape or the like can be mentioned. Alternatively, like the inorganic glass molded body 130 shown in FIGS. 2A to 2D, it may be a shape including a convex portion 131 covering at least a portion of the side surface of the LED element.

<Manufacturing Method of LED Device>

(First Manufacturing Method)

An LED device according to an embodiment of the present invention can be manufactured, for example, by using a curable resin as follows. First, a material for forming a bonding portion (for example, a resin composition containing a curable resin) is dropwise added onto the light emitting surface of an LED element disposed on a substrate. Subsequently, the inorganic glass molded body is placed on the dropped material, and the inorganic glass molded body is further pushed toward the LED element. As a result, the material dropped on the LED element is expanded and placed also around the LED element (in other words, between the substrate and the inorganic glass molded body). Here, by pushing the inorganic glass molded body at a pressure of $1.0 \times 10^4$ to $1.0 \times 10^7$ N/m$^2$, the distance between the LED element and the inorganic glass molded body can be precisely controlled to 0.1 mm or less.

Subsequently, when the curable resin contained in the material is a thermosetting resin, the resin is cured by a heat treatment. For example, the heating temperature is preferably from 120 to 200° C. and more preferably from 140 to 200° C. The heating time is preferably from 0.5 to 24 hours and more preferably from 1 to 10 hours. By setting the heating temperature and heating time within these ranges, the cured product of the resin composition will have sufficient strength.

Further, when the curable resin contained in the material is a photocurable resin, the resin is cured by light irradiation or by a combination of light irradiation and a heat treatment. For example, it is preferable to irradiate light with an integrated irradiation amount of 100 to 10,000 mJ/cm$^2$ by irradiating light having a wavelength of 200 to 400 nm for 10 seconds to 1 hour. As a result, it is possible to obtain an LED device in which the LED element is shielded from the outside air by the substrate, the inorganic glass molded body and the bonding portion. In the present manufacturing method, the material for forming the bonding portion (that is, the first bonding portion) for bonding the substrate and the inorganic glass molded body and the material for forming the second bonding portion present between the LED element and the inorganic glass molded body are the same material.

That is, one aspect of the method for manufacturing an LED device according to an embodiment of the present invention includes:

dropping a material containing a curable resin onto a light emitting surface of an LED element disposed on a substrate;

placing an inorganic glass molded body on the dropped material containing the curable resin;

pushing the inorganic glass molded body toward the LED element at a pressure of $1.0 \times 10^4$ to $1.0 \times 10^7$ N/m$^2$; and curing a material containing the curable resin.

(Second Manufacturing Method)

The LED device according to an embodiment of the present invention can also be manufactured by the following manufacturing method. First, an inorganic glass molded body is placed on a light emitting surface of an LED element disposed on a substrate. Subsequently, a material for forming a bonding portion (for example, a resin composition containing a curable resin) is dropwise added around the LED element (between the substrate and the inorganic glass molded body).

Subsequently, when the curable resin contained in the material is a thermosetting resin, the resin is cured by a heat treatment. For example, the heating temperature is preferably from 120 to 200° C. and more preferably from 140 to 200° C. The heating time is preferably from 0.5 to 24 hours and more preferably from 1 to 10 hours. By setting the heating temperature and heating time within these ranges, the cured product of the resin composition will have sufficient strength.

Further, when the curable resin contained in the material is a photocurable resin, the resin is cured by light irradiation or by a combination of light irradiation and a heat treatment. For example, it is preferable to irradiate light with an integrated irradiation amount of 100 to 10,000 mJ/cm$^2$ by irradiating light having a wavelength of 200 to 400 nm for 10 seconds to 1 hour.

As a result, it is possible to obtain an LED device in which the LED element is shielded from the outside air by the substrate, the inorganic glass molded body and the bonding portion. In the manufacturing method of the present embodiment, no bonding portion is present between the LED element and the inorganic glass molded body, and the distance between the LED element and the inorganic glass molded body is 0 mm (that is, they are in contact with each other).

That is, another aspect of the method for manufacturing an LED device according to an embodiment of the present invention includes:

placing an inorganic glass molded body on a light emitting surface of an LED element disposed on a substrate; dropping a material containing a curable resin which is a material for forming a bonding portion around the LED element; and curing the material.

(Third Manufacturing Method)

The LED device according to an embodiment of the present invention can also be manufactured by the following manufacturing method. First, a material containing a small amount of a curable resin (a material for forming the second bonding portion) is dropwise added onto a light emitting surface of an LED element disposed on a substrate. This material is for fixing the inorganic glass molded body onto the LED element.

Subsequently, the inorganic glass molded body is placed on the dropped material, and the inorganic glass molded body is further pushed toward the LED element. Here, by pushing the inorganic glass molded body at a pressure of $1.0 \times 10^4$ to $1.0 \times 10^7$ N/m$^2$, the distance between the LED element and the inorganic glass molded body can be precisely controlled to 0.1 mm or less.

Subsequently, the curable resin contained in the material is cured by a heat treatment or the like, and the inorganic glass molded body is fixed onto the LED element. As a result, it is possible to prevent the inorganic glass molded body from moving and shifting the position thereof in the later process.

Subsequently, a material (for example, a resin composition containing a curable resin) for forming a bonding portion (first bonding portion) is disposed by potting or the like around the LED element (between the substrate and the inorganic glass molded body). Subsequently, the curable resin contained in this material is cured by a heat treatment or the like. As a result, it is possible to obtain an LED device in which the LED element is shielded from the outside air by the substrate, the inorganic glass molded body and the bonding portion. In the present manufacturing method, the material for forming the bonding portion (first bonding portion) for bonding the substrate and the inorganic glass molded body and the material for forming the second bonding portion present between the LED element and the inorganic glass molded body may be the same or different.

That is, yet another aspect of the method for manufacturing an LED device according to an embodiment of the present invention includes:

dropping a material containing a curable resin which is a material for forming the second bonding portion onto a light emitting surface of an LED element disposed on a substrate;

placing an inorganic glass molded body on the dropped material;

pushing the inorganic glass molded body toward the LED element at a pressure of $1.0 \times 10^4$ to $1.0 \times 10^7$ N/m$^2$;

curing the material;

disposing a material containing a curable resin which is a material for forming a first bonding portion around the LED element; and curing the material for forming the first bonding portion.

According to the above manufacturing method, an LED device can be manufactured without damaging the LED element due to a high-temperature process.

Further, it is possible to manufacture an LED device in which incorporation of bubbles into the light transmitting portion is suppressed.

<LED Module>

The present invention provides an LED module including a plurality of the LED devices described above as an embodiment.

Figure 4A:
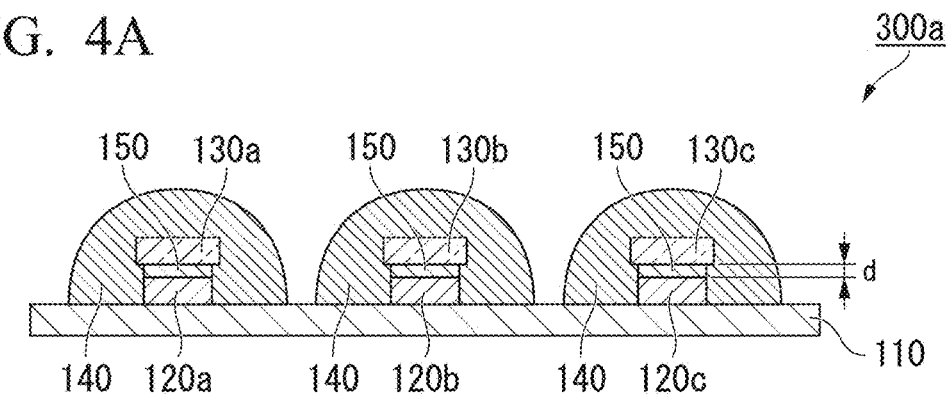
FIG. 4A is a cross-sectional view showing a modified example of an LED module.
Figure 4B:
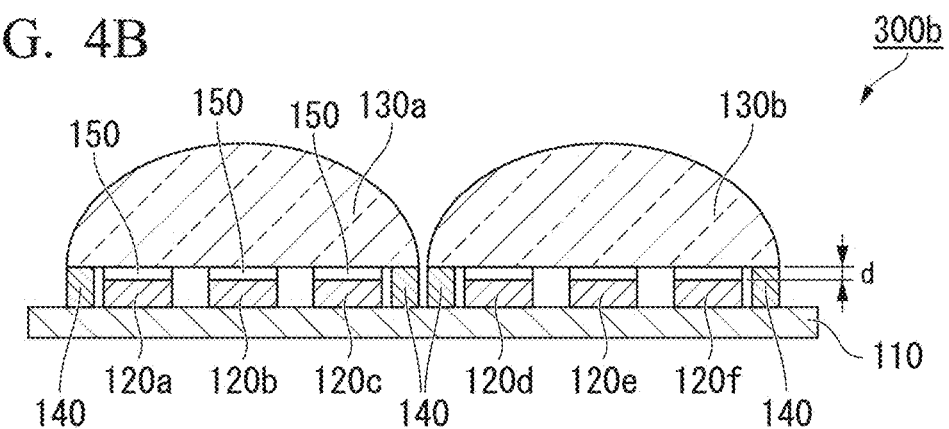
FIG. 4B is a cross-sectional view showing a modified example of the LED module.
Figure 4C:
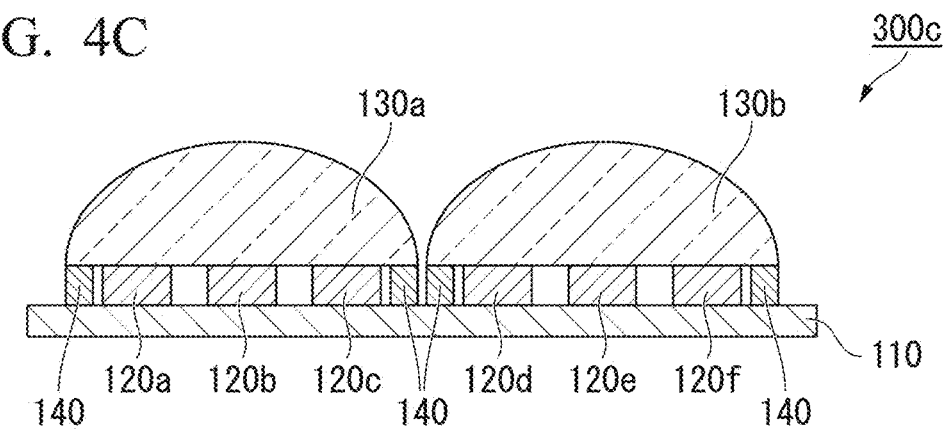
FIG. 4C is a cross-sectional view showing a modified example of the LED module.

FIGS. 4A, 4B, and 4C are each cross-sectional views showing an example of an LED module according to an embodiment of the present invention. As shown in FIG. 4A, the LED module 300a includes a plurality of LED devices that are the same as the above-described LED device 100d except that the size of the inorganic glass molded body in plan view is larger.

The LED module 300b in FIG. 4B is provided with a plurality of LED devices including a plurality of LED elements of the above-described LED device 100b.

The LED module 300c in FIG. 4C is provided with a plurality of LED devices including a plurality of LED elements of the above-described LED device 100f.

The LED module including a plurality of LED devices is not limited to the LED devices 300a, 300b, and 300c described above, and may be, for example, a combination of LED devices 100a, 100b, 100c, 100d, 100f, and the like.

Further, in the LED module according to an embodiment of the present invention, the number of LED devices is not particularly limited, and the number of LED devices according to the purpose can be appropriately used. The number of the LED devices is preferably, for example, from 2 to 100, more preferably from 2 to 50, still more preferably from 2 to 20, and particularly preferably from 2 to 10. By making the number of LED devices within this range, the weight of the LED module is reduced.

<Ultraviolet Light Emitting Device>

The present invention provides, as an embodiment, an ultraviolet light emitting device including the LED device or the LED module as described above. The ultraviolet light emitting device according to an embodiment of the present invention is highly reliable because the LED element is manufactured without being damaged by the high temperature process. Further, since the incorporation of bubbles into the light transmitting portion is suppressed, the light extraction efficiency is high. In addition, since the inorganic glass molded body is disposed in the vicinity of the LED element, it is excellent in heat resistance and light resistance. Furthermore, by changing the shape of the inorganic glass molded body, the optical properties can be controlled.

EXAMPLES

Hereinafter, the present invention will be described in detail with reference to Examples, although the present invention is not limited to the following Examples.

Example 1

80 parts by weight of a condensation polymerization-type silicone resin (model number "KR-220L" manufactured by Shin-Etsu Chemical Co., Ltd.) and 20 parts by weight of 2-butoxyethyl acetate were added to a screw bottle and stirred, and 2 parts by weight of a phosphoric acid-based catalyst (model number "X-40-2309A" manufactured by Shin-Etsu Chemical Co., Ltd.) was further added thereto as a curing catalyst, and the resulting mixture was stirred to obtain a silicone resin composition A.

6.6 mg of the silicone resin composition A was added dropwise onto an LED element disposed on a low-temperature co-fired ceramic (LTCC) substrate of 3.5 mm in length×3.5 mm in width using a dropper, and then a commercially available hemispherical quartz glass lens having a diameter of 2.0 mm (manufactured by Opto Science, Inc.) was placed thereon. A force of 100 g (0.98 N) was applied to the upper portion of the quartz glass lens for 5 seconds, and it was bonded and encapsulated with the substrate and the LED element. At this time, the pressure applied to the bottom surface of the quartz glass lens corresponds to $3.1 \times 10^5$ (N/m$^2$).

Subsequently, in a encapsulated state, a heat treatment was performed in an oven at 150° C. for 5 hours to cure the silicone resin composition A, thereby obtaining an LED device of Example 1.

Figure 5:
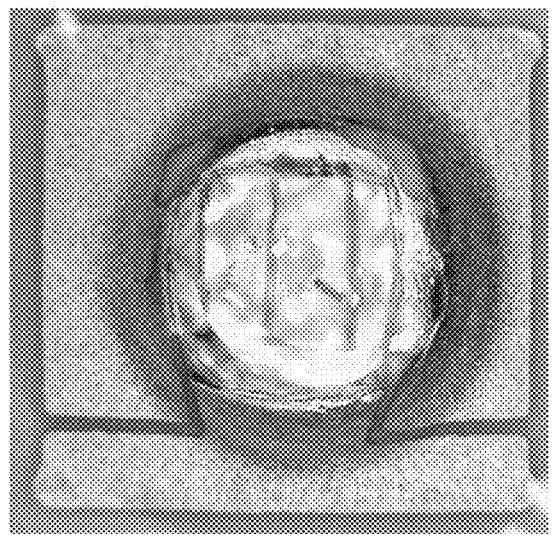
FIG. 5 is a microscopic photograph of an LED device of Example 1.

Subsequently, using a microscope (trade name "Dino-Lite", manufactured by AnMo Electronics Corporation), incorporation of bubbles into the light transmitting portion of the LED device of Example 1 was observed. FIG. 5 is a microscopic photograph of the LED device of Example 1. As a result, bubbles having a size of 0.1 mm or more were not observed in the light transmitting portion.

The thickness of the manufactured LED device was measured using a thickness gauge (model "547-401 Absolute Digimatic Thickness Gauge" manufactured by Mitutoyo Corporation, resolution: 0.01 mm). The thickness was measured as follows. First, the thicknesses of the LED element and the substrate and the thickness of the quartz glass lens were measured and found to be 0.55 mm and 1.00 mm, respectively. Next, the thickness of the LED device of Example 1 was measured and found to be 1.55 mm at the thickest place. From these results, the distance between the bonding surfaces between the LED element and the quartz glass lens (that is, the above-mentioned distance d) was 0.01 mm or less.

Comparative Example 1

5.4 mg of the silicone resin composition A used in Example 1 was added dropwise onto an LED element disposed on an LTCC substrate of 3.5 mm in length×3.5 mm in width using a dropper. Subsequently, the quartz glass lens used in Example 1 was supported and fixed at a position where the silicone resin composition A and the quartz glass lens were in contact with each other and the light emitted from the LED passes through the quartz glass lens, so that the clearance was 0.7 mm.

Figure 6:
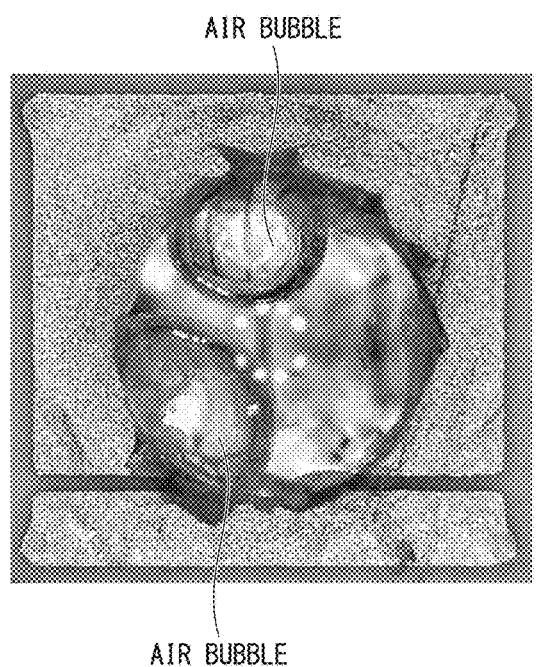
FIG. 6 is a microscopic photograph of an LED device of Comparative Example 1.

Subsequently, the silicone resin composition A was cured by carrying out a heat treatment at 150° C. for 5 hours using an oven to obtain an LED device of Comparative Example 1. Subsequently, incorporation of bubbles into the resin of the light transmitting portion of the LED device of Comparative Example 1 was observed in the same manner as in Example 1. FIG. 6 is a microscopic photograph of the LED device of Comparative Example 1. As a result, bubbles having a size of 0.1 mm or more were observed in the light transmitting portion.

Subsequently, the thickness of the LED device of Comparative Example 1 was measured using a thickness gauge in the same manner as in Example 1. First, the thicknesses of the LED element and the substrate and the thickness of the quartz glass lens were measured and found to be 0.55 mm and 1.00 mm, respectively. Next, the thickness of the LED device of Comparative Example 1 was measured and found to be 2.17 mm at the thickest place. From these results, the distance between the bonding surfaces between the LED element and the quartz glass lens was 0.62 mm.

Example 2

A quartz glass plate (1.50 mm in length×1.50 mm in width×0.53 mm in thickness) was placed on an LED element disposed on an LTCC substrate of 3.5 mm in length×3.5 mm in width, and fixed with a heat resistant tape. The silicone resin composition A of Example 1 was added dropwise using a dropper so that the quartz glass plate and the LTCC substrate were bonded.

Subsequently, in a encapsulated state, a heat treatment was performed in an oven at 150° C. for 3 hours to cure the silicone resin composition A, and then the heat resistant tape was removed to obtain an LED device of Example 2.

Figure 7:
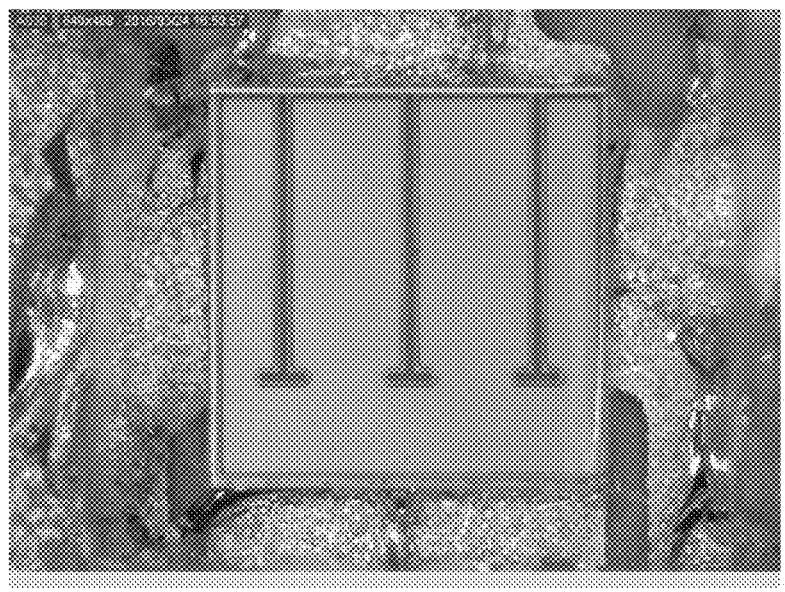
FIG. 7 is a microscopic photograph of an LED device of Example 2.

Subsequently, using the microscope, incorporation of bubbles into the light transmitting portion of the LED device of Example 2 was observed. FIG. 7 is a microscopic photograph of the LED device of Example 2. As a result, bubbles having a size of 0.1 mm or more were not observed in the light transmitting portion.

The thickness of the manufactured LED device was measured using a thickness gauge. The thickness was measured as follows. First, the thicknesses of the LED element and the substrate and the thickness of the quartz glass plate were measured and found to be 0.54 mm and 0.53 mm, respectively. Next, the thickness of the LED device of Example 2 was measured and found to be 1.07 mm at the thickest place. From these results and the manufacturing conditions of the LED device, the distance between the bonding surfaces between the LED element and the quartz glass plate was 0 mm.

After the quartz glass plate was peeled off from the manufactured LED device, the infrared absorption spectra of the surface of the LED element which was the bonding surface and the surface of the quartz glass plate which was the bonding surface were measured under the following measurement conditions. As a result, no absorption peak (peak at 1,250 to 1,300 cm$^{-1}$ derived from the expansion and contraction of Si—CH$_3$ bond) derived from the cured product of the silicone resin composition A was observed from either of them. Also from these results, it was confirmed that there was no cured product of the silicone resin composition A present between the LED element and the quartz glass plate.

Figure 8:
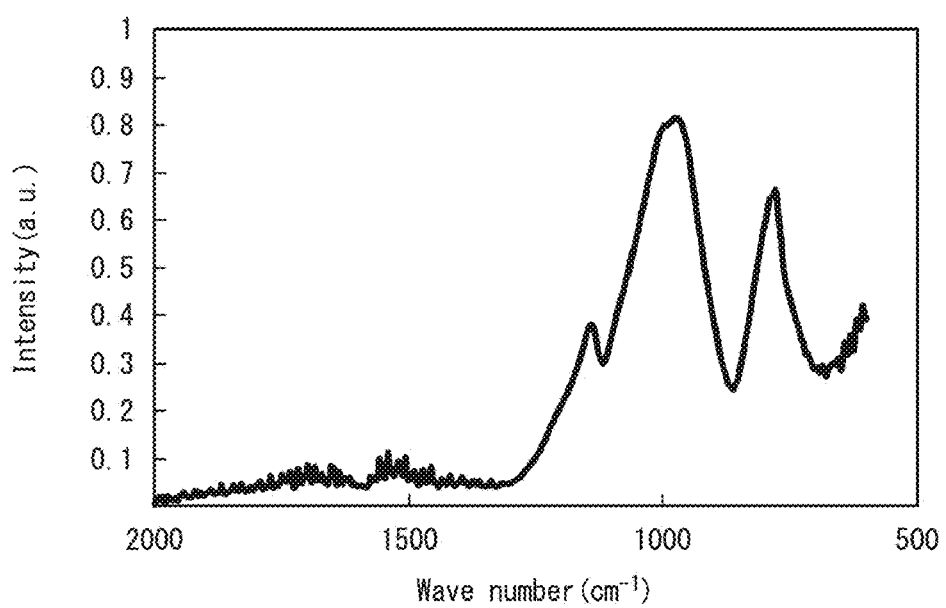
FIG. 8 is an infrared absorption spectrum of a quartz glass plate surface which was a bonding surface between an LED element and a quartz glass plate in the LED device of Example 2.
Figure 9:
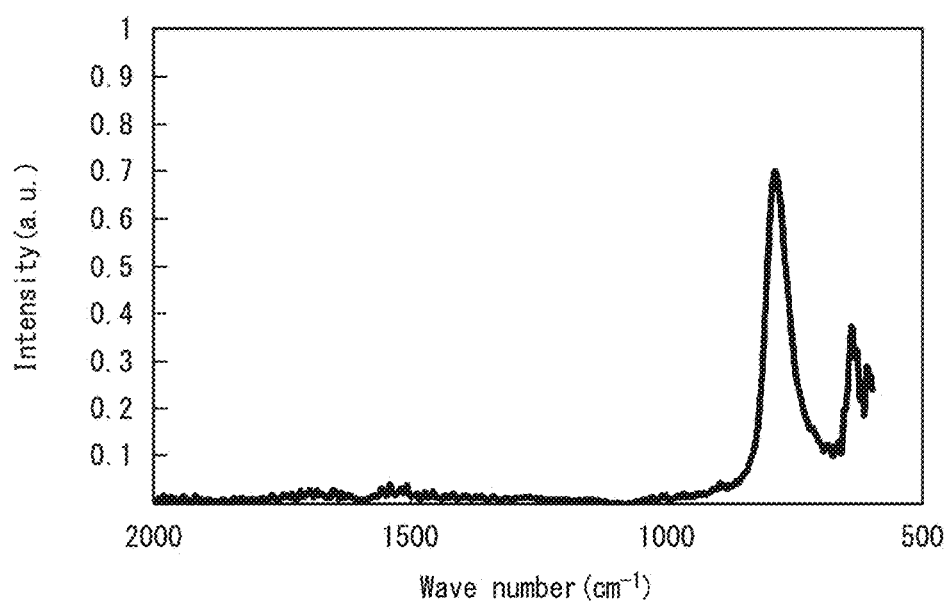
FIG. 9 is an infrared absorption spectrum of an LED element surface which was a bonding surface between an LED element and a quartz glass plate in the LED device of Example 2.

<Infrared Absorption Spectrum Measurement>
  Device name: JASCO FT/IR 460
  Attachment: PIKE MIRACLE
  Measurement wavelength: 4,000 to 600 cm$^{-1}$
  Resolution: 4 cm$^{-1}$
  Background measurement: atmospheric air
  Number of integrations: 32 times FIG. 8 is an infrared absorption spectrum of the quartz glass plate surface which was a bonding surface. FIG. 9 is an infrared absorption spectrum of the LED element surface which was a bonding surface.

Evaluation of a cured product of a silicone resin composition B and a composition of a silicone resin composition C described below was carried out under the following measurement conditions.

<Transmittance Measurement>
  Device name: JASCO Engineering (V670)
  Attachment: integrating sphere JASCO ISN-723
  Measurement wavelength: 200 to 800 nm
  Background measurement: atmospheric air
  Measurement speed: 1,000 nm/min <UV Irradiation Test>
  Device name: manufactured by Ushio Inc. (SP-9-250 DB)
  UV irradiation wavelength: 250 nm to 450 nm
  UV irradiation intensity: 31.8 mW/cm$^2$ (254 nm)
  Resin heating temperature: 100° C. (by hot plate)
  UV irradiation time: 100 hours
  Lens: uniform irradiation optical unit 50175Q
  Lens diameter: 50 mm
  Distance between sample and lens: 175 mm Reference Example 1

70 parts by weight of a silicone resin (model number "KR-220L" manufactured by Shin-Etsu Chemical Co., Ltd.) and 30 parts by weight of 2-butoxyethyl acetate were added to a screw bottle and stirred, and 2 parts by weight of a phosphoric acid-based catalyst (model number "X-40-2309A" manufactured by Shin-Etsu Chemical Co., Ltd.) was further added thereto as a curing catalyst, and the resulting mixture was stirred to obtain a silicone resin composition B.

The silicone resin composition B was coated on an alkali-free glass substrate (EAGLE XGC manufactured by Corning Incorporated, thickness: 0.7 mm) using an applicator, and then a heat treatment was performed at 150° C. for 5 hours to cure the silicone resin composition B using an air-blowing constant temperature thermostat (DKN 302 manufactured by Yamato Scientific Co., Ltd.). The cured product of the obtained silicone resin composition B was in close contact with the alkali-free glass substrate, and no crack was observed. The thickness of the cured product of the obtained silicone resin composition B was measured using a thickness gauge and found to be 0.03 mm.

The UV irradiation test of the cured product of the obtained silicone resin composition B was carried out. When the state of the cured product of the silicone resin composition B after the UV irradiation test was visually observed, cracks were not observed. The transmittance retention rate was calculated by dividing the transmittance of the cured product of the silicone resin composition B at 300 nm after the UV irradiation test with the transmittance of the cured product of the silicone resin composition B at 300 nm before the UV irradiation test, and found to be 90%.

Reference Example 2

50 parts by weight of KER-2500 A and 50 parts by weight of KER-2500 B in an addition type silicone resin (KER-2500 A/B, manufactured by Shin-Etsu Chemical Co., Ltd.) were added to a screw bottle and stirred to obtain a silicone composition C.

The silicone composition C was coated on an alkali-free glass substrate and cured in the same manner as in Reference Example 1. The cured product of the obtained silicone resin composition C was in close contact with the alkali-free glass substrate, and no crack was observed. The thickness of the cured product of the obtained silicone resin composition C was measured using a thickness gauge and found to be 0.03 mm.

The UV irradiation test of the cured product of the obtained silicone resin composition C was carried out. When the state of the cured product of the silicone resin composition C after the UV irradiation test was visually observed, cracks were observed. The transmittance retention rate was calculated by dividing the transmittance of the cured product of the silicone resin composition C at 300 nm after the UV irradiation test with the transmittance of the cured product of the silicone resin composition C at 300 nm before the UV irradiation test, and found to be 83%.

INDUSTRIAL APPLICABILITY

The present invention can provide an LED device in which optical properties are controlled by an inorganic glass molded body, an LED element is not damaged by a high temperature process and incorporation of bubbles into a resin of a light transmitting portion is suppressed, and can also provide an LED module and an ultraviolet light emitting device including the above LED device, and it is therefore extremely useful industrially.

REFERENCE SIGNS LIST 100a, 100b, 100c, 100d, 100f, 100e, 200a, 200b: LED device; 110: Substrate; 120, 120a, 120b, 120c, 120d, 120e, 120f: LED element; 121: Light emitting surface; 130, 130a, 130b, 130c: Inorganic glass molded body; 131: Convex portion; 140: Bonding portion (first bonding portion); 150: Bonding portion (second bonding portion); 300a, 300b, 300c: LED module; d: distance.

The invention claimed is:
1. An LED device comprising:
a substrate;
an LED element disposed on the substrate;
an inorganic glass molded body disposed at a position where all or a part of light which is emitted from the LED element passes through;
a first bonding portion that is provided in contact with the substrate and bonds the substrate and the inorganic glass molded body; and
a second bonding portion provided between the LED element and the inorganic glass molded body,
  wherein the LED element is shielded from outside air by the substrate, the inorganic glass molded body and the first bonding portion;
  wherein the second bonding portion comprises a cured product of a condensation polymerization-type silicone resin;

wherein a distance between the first bonding portion and the LED element is 0 mm or more and 0.5 mm or less; and wherein a distance between the LED element and the inorganic glass molded body is 0.1 mm or less.

2. An LED device comprising:

a substrate;

an LED element disposed on the substrate;

an inorganic glass molded body disposed at a position where all or a part of light which is emitted from the LED element passes through; and a bonding portion that is provided in contact with the substrate and bonds the substrate and the inorganic glass molded body, wherein the LED element is shielded from outside air by the substrate, the inorganic glass molded body and the bonding portion;

wherein the bonding portion comprises a cured product of a silicone resin; and wherein a distance between the LED element and the inorganic glass molded body is 0 mm.

3. The LED device according to claim 1, wherein the inorganic glass molded body comprises a convex portion covering at least a part of a side surface of the LED element.

4. The LED device according to claim 3, wherein the convex portion encloses a periphery of the LED element in a closed ring shape in a plan view.

5. The LED device according to claim 1, wherein the first bonding portion comprises a curable resin.

6. The LED device according to claim 5, wherein the curable resin is a silicone resin.

7. The LED device according to claim 1, wherein the inorganic glass molded body is composed of silica glass or borosilicate glass.

8. The LED device according to claim 1, wherein a peak wavelength of the light which is emitted from the LED element is 400 nm or less.

9. The LED device according to claim 1, wherein the LED element is flip-chip mounted on the substrate.

10. The LED device according to claim 1, wherein the first bonding portion internally embeds the LED element and the inorganic glass molded body.

11. The LED device according to claim 1, further comprising a plurality of the LED elements, wherein the inorganic glass molded body is disposed at a position where all or a part of light which is emitted from the plurality of LED elements passes through.

12. An LED module comprising a plurality of the LED devices according to claim 1.

13. An ultraviolet light emitting device comprising the LED device according to claim 1.

14. The LED device according to claim 1, wherein the first bonding portion comprises a cured product of a silicone resin.

* * * * *